(12) United States Patent
Wang

(10) Patent No.: US 10,811,477 B2
(45) Date of Patent: Oct. 20, 2020

(54) FLEXIBLE ORGANIC LIGHT EMITTING DISPLAY DEVICE AND MANUFACTURING METHOD THEREOF

(71) Applicant: Wuhan China Star Optoelectronics Semiconductor Display Technology Co., Ltd., Wuhan (CN)

(72) Inventor: Bo Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/323,775

(22) PCT Filed: Dec. 24, 2018

(86) PCT No.: PCT/CN2018/123124
§ 371 (c)(1),
(2) Date: Feb. 7, 2019

(87) PCT Pub. No.: WO2020/113702
PCT Pub. Date: Jun. 11, 2020

(65) Prior Publication Data
US 2020/0203444 A1   Jun. 25, 2020

(51) Int. Cl.
*H01L 27/32* (2006.01)
*H01L 51/50* (2006.01)
(Continued)

(52) U.S. Cl.
CPC ...... *H01L 27/3246* (2013.01); *H01L 51/5056* (2013.01); *H01L 51/5072* (2013.01);
(Continued)

(58) Field of Classification Search
CPC .................. H01L 27/3246; H01L 27/3295
See application file for complete search history.

(56) References Cited

U.S. PATENT DOCUMENTS

2005/0164520 A1* 7/2005 Muranaka ............. H01L 21/312
                                                                438/778
2005/0200273 A1* 9/2005 Nozawa ............... H01L 27/3246
                                                                313/503
(Continued)

FOREIGN PATENT DOCUMENTS

CN     106775173     5/2017
CN     106848107     6/2017
(Continued)

*Primary Examiner* — Selim U Ahmed
*Assistant Examiner* — Evan G Clinton

(57) ABSTRACT

A flexible organic light emitting display device includes a flexible substrate, an insulating layer, a polymer flat layer, an anode, and a pixel isolation layer. The pixel isolation layer and the anode are alternately disposed on the polymer flat layer, and the pixel isolation layer includes a first pixel isolation layer disposed on a bent area and a second pixel isolation layer disposed on a flat area. A thickness of the first pixel isolation layer is greater than a thickness of the second pixel isolation layer. A method of manufacturing an organic light emitting display device is further provided by increasing the thickness of the pixel isolation layer of the bent area, mechanical stress generated by a flexible organic light emitting diode (OLED) display device during bending can be reduced, thereby improving the bending performance of the flexible OLED display device.

4 Claims, 2 Drawing Sheets

(51) Int. Cl.
*H01L 51/52* (2006.01)
*H01L 51/56* (2006.01)

(52) U.S. Cl.
CPC ...... *H01L 51/5092* (2013.01); *H01L 51/5096* (2013.01); *H01L 51/5237* (2013.01); *H01L 51/5293* (2013.01); *H01L 51/56* (2013.01); *H01L 2251/301* (2013.01); *H01L 2251/5338* (2013.01)

(56) References Cited

U.S. PATENT DOCUMENTS

| | | | |
|---|---|---|---|
| 2009/0212687 A1* | 8/2009 | Cok | H01L 51/5265 313/504 |
| 2014/0374704 A1* | 12/2014 | Jang | H01L 51/0097 257/40 |
| 2018/0226454 A1 | 8/2018 | Liu et al. | |
| 2019/0131364 A1* | 5/2019 | Hayk | G09F 9/301 |
| 2019/0237524 A1* | 8/2019 | Chen | H01L 51/525 |
| 2019/0326544 A1 | 10/2019 | Huang et al. | |

FOREIGN PATENT DOCUMENTS

| | | |
|---|---|---|
| CN | 108054291 | 5/2018 |
| CN | 108598108 | 9/2018 |

* cited by examiner

FLEXIBLE ORGANIC LIGHT EMITTING DISPLAY DEVICE AND MANUFACTURING METHOD THEREOF

RELATED APPLICATIONS

This application is a National Phase of PCT Patent Application No. PCT/CN2018/123124 having International filing date of Dec. 24, 2018, which claims the benefit of priority of Chinese Patent Application No. 201811463397.2 filed on Dec. 3, 2018. The contents of the above applications are all incorporated by reference as if fully set forth herein in their entirety.

FIELD AND BACKGROUND OF THE INVENTION

The present invention relates to a technical filed of displays, and particularly to a flexible organic light emitting display device and a manufacturing method thereof.

Organic light-emitting diode (OLED) display devices also refer to organic electroluminescent display devices, or organic light emitting semiconductors. The basic structure of an OLED is packaged as a sandwich structure, such that a thin and transparent indium tin oxide (ITO) having semiconductor characteristics is connected with a positive electrode of electricity, and a metal cathode is provided. An entire structural layer of an OLED includes a hole transport layer (HTL), a light emitting layer (EL), and an electron transport layer (ETL). When the power is supplied at appropriate voltage, a positive hole and a cathode charge are combined in the light-emitting layer, and excitons (electron-hole pair) in an excited state are combined in certain probability under the action of Coulomb force. The excited state is unstable in a normal environment, the excitons in the excited state recombine and transfer energy to a luminescent material, causing the luminescent material to transition from a ground state energy level to the excited state. An excited state energy generates photons through a process of radiation relaxation, releasing light energy, producing light, and generating red, green, and blue RGB, the three primary colors, according to different formulas to form a basic color.

First, OLEDs are characterized in being self-luminous, unlike thin film transistor-liquid crystal displays (TFT-LCDs) in need of backlight, and therefore have high visibility and brightness. Second, OLEDs have become one of the most important display technology due to advantages of lower voltage demand, higher power-saving efficiency, quick response times, light weight, thin thickness, simple structure, low costs, wide viewing angles, almost infinite contrast, and lower consumption, and are gradually replacing TFT-LCDs, expectedly to be the mainstream in the next generation of displays after LCDs.

With the progress of the times, flat display devices are incapable of satisfying requirements for specific situations, pushing the industries to start to research and develop flexible and bendable display devices, wherein OLEDs are configured with a flexible substrate made of a flexible material, thereby forming the flexible and bendable display devices. Thus, how to improve bending performance of flexible display devices becomes a key issue at the moment.

SUMMARY OF THE INVENTION

An object of the present invention is to provide a flexible organic light emitting display devices capable of overcoming the problem of poor bending performance existing in current flexible display devices.

To overcome the above-mentioned problem, the present invention provides a flexible organic light emitting display device, defined with a bent area and a flat area, and comprising a flexible substrate, an insulating layer, a polymer flat layer, an anode, and a pixel isolation layer sequentially disposed, wherein the flexible substrate is disposed in the bent area and the flat area; the buffer layer is disposed on the flexible substrate; the insulating layer is disposed on the buffer layer; the polymer flat layer is disposed on the insulating layer; and the pixel isolation layer and the anode are alternately disposed on the polymer flat layer, and wherein the pixel isolation layer comprises a first pixel isolation layer disposed on the bent area and a second pixel isolation layer disposed on the flat area, and a thickness of the first pixel isolation layer is greater than a thickness of the second pixel isolation layer In one aspect of the present invention, the second pixel isolation layer has a thickness ranging from 0.5 to 2 micrometers.

In one aspect of the present invention, the first pixel isolation layer has a thickness ranging from 0.6 to 4 micrometers.

In one aspect of the present invention, the insulating layer is composed of a first insulating layer, a second insulating layer, and a third insulating layer, and the insulating layer further comprises a gate electrode, a source electrode, and a drain electrode disposed therein.

In one aspect of the present invention, the flexible organic light emitting display device further comprises: an organic layer disposed on the pixel isolation layer and the anode; an encapsulation layer disposed on the organic layer; and a structural layer disposed on the encapsulation layer.

In one aspect of the present invention, the organic layer comprises a hole injection layer, a hole transport layer, an electron blocking layer, a light emitting layer, an electron transport layer, an electron injection layer, a cathode, a cavity length adjustment layer, and a LiF layer.

In one aspect of the present invention, the structural layer comprises a polarizer, a touch layer, and a cover.

In one aspect of the present invention, the encapsulation layer is made of an inorganic material, and the inorganic material is at least one of silicon nitride (SiNx), silicon oxide (SiOx), silicon oxynitride (SiONx), silicon carbonnitride (SiCNx), and $Al_2O_3$.

In one aspect of the present invention, the encapsulation layer is made of an organic material, and the organic material is at least one of acrylic and epoxy resin. Another object of the present invention is to provide a method of manufacturing an organic light emitting display device, wherein the organic light emitting display device is defined with a bent area and a flat area and the method comprises:
step S1: providing a flexible substrate;
step S2: forming a buffer layer on the flexible substrate;
step S3: forming an insulating layer on the buffer layer;
step S4: forming a polymer flat layer on the insulating layer;
step S5: coating, through a photolithography process, a pixel isolation layer on the polymer flat layer, then etching, through the photolithography process, the pixel isolation layer located corresponding to a flat area but remaining the pixel isolation layer located corresponding to a bent area, and coating a pixel isolation layer again on the polymer flat layer to form a first pixel isolation layer on the bent area and a second pixel isolation layer on the flat area, and then etching all pixel regions through the photolithography process, and forming, by filling the pixel regions, an anode;

step S6: forming an organic layer on the first pixel isolation layer, the second pixel isolation layer, and the anode;

step S7: forming an encapsulation layer on the organic layer; and step S8: forming a structural layer on the encapsulation layer.

The present invention relates to a flexible organic light emitting display device and a manufacturing method thereof. By increasing the thickness of the pixel isolation layer of the bent area, mechanical stress generated by a flexible organic light emitting diode (OLED) display device during bending can be reduced, thereby improving the bending performance of the flexible OLED display device.

BRIEF DESCRIPTION OF THE SEVERAL VIEWS OF THE DRAWINGS

To describe the technical solutions in the embodiments of the present invention, the following briefly introduces the accompanying drawings for describing the embodiments. Apparently, the accompanying drawings in the following description show merely some embodiments of the present invention, and a person skilled in the art may still derive other drawings from these accompanying drawings without creative efforts.

DESCRIPTION OF SPECIFIC EMBODIMENTS OF THE INVENTION

Figure 1:
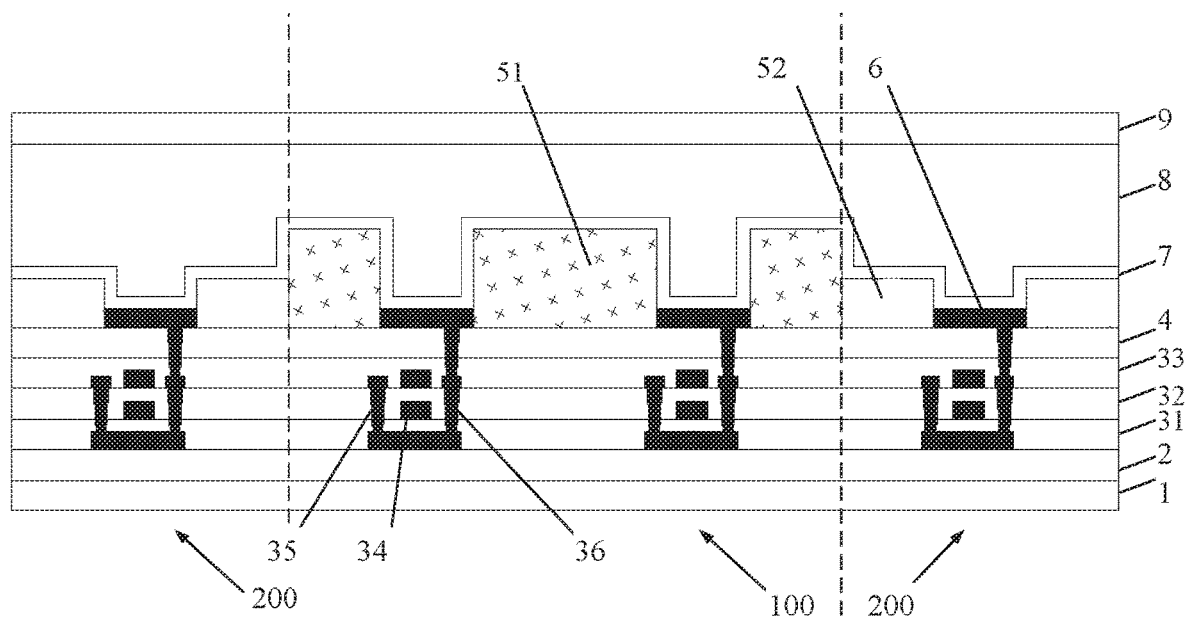
FIG. 1 is a schematic structural view of a flexible organic light emitting display device of the present invention.

Hereafter, embodiments of the present invention will be described in detail with reference to the accompanying drawings to a person skilled in the art. The invention can be implemented by way of example to make the technical content of the present disclosure clearer, so that those skilled in the art can more easily understand how to implement the present invention. The present invention, however, may be embodied in many different forms of embodiments, and the scope of the present invention is not limited to the embodiments described herein. The description of the embodiments below is not intended to limit the scope of the invention.

Directional terms described by the present invention, such as upper, lower, front, back, left, right, inner, outer, side and etc., are only directions by referring to the accompanying drawings, and thus the used directional terms are used to describe and understand the present invention, but the present invention is not limited thereto.

The drawings and description are to be regarded as illustrative in nature and not restrictive. Like reference numerals designate like elements throughout the specification. In addition, the size and thickness of each component shown in the drawings are arbitrarily shown for understanding and ease of description, but the present invention is not limited thereto.

When an element is referred to as being "on" another element, it can be directly on the other element or intervening elements may also be present. It will be understood that, when an element is referred to as being "installed on" or "connected to" another element, it can be directly "installed on" or "connected to" the other element or intervening elements may also be present.

As shown in FIG. 1, a flexible organic light emitting display device is defined with a bent area 100 and a flat area 200, and includes a flexible substrate 1, a buffer layer 2, a first insulating layer 31, a second insulating layer 32, a third insulating layer 33, a polymer flat layer 4, a first pixel isolation layer 51, a second pixel isolation layer 52, an anode 6, an organic layer 7, and an encapsulation layer 8, and a structural layer 9, which are all sequentially disposed.

The flexible substrate 1 is made of metal or a polymer-based material. The flexible substrate 1 made of such materials has greater flexibility and is capable of meeting requirements of different organic light-emitting diode (OLED) displays devices.

The buffer layer 2 is disposed on the flexible substrate 1 and is mainly made of at least one of silicon nitride (SiNx) and silicon oxide (SiOx). The buffer layer 2 formed so is relatively dense and flat.

The first insulating layer 31 is disposed on the buffer layer 2 and is mainly made of at least one of SiNx and SiOx. The buffer layer 2 formed so is relatively dense and flat.

The second insulating layer 32 is disposed on the first insulating layer 31 and is mainly made of at least one of SiNx and SiOx. The buffer layer 2 formed so is relatively dense and flat.

The third insulating layer 33 is disposed on the second insulating layer 32 and is mainly made of at least one of SiNx and SiOx. The buffer layer 2 formed so is relatively dense and flat.

A gate electrode 34, a source electrode 35, and a drain electrode 36 are configured in the first insulating layer 31, the second insulating layer 32, and the third insulating layer 33. When a positive voltage is applied to the gate electrode 34, an electric field is generated between the gate electrode 34 and a semiconductor layer. Under action of the electric field, an electron flow path is formed to form a conduction state between the source electrode 35 and the drain electrode 36. The higher the voltage is applied to the gate electrode 34, the more electrons are attracted, so the larger the on current is. When negative voltage is applied to the gate electrode 34, a closed state is formed between the source electrode 35 and the drain electrode 36.

A pixel isolation layer and the anode 6 are alternately disposed on the polymer flat layer 4. The pixel isolation layer includes the first pixel isolation layer 51 disposed on the bent area and the second pixel isolation layer 52 disposed on the flat area. A thickness of the first pixel isolation layer 51 is greater than a thickness of the second pixel isolation layer 52. Specifically, the thickness of the second pixel isolation layer 52 ranges from 0.5 to 2 micrometers (μm) and the thickness of the first pixel isolation layer 51 ranges from 0.6 to 4 μm. When the thickness of the second pixel isolation layer 52 is less than 0.5 μm, the second pixel isolation layer 52 is thus decreased in uniformity and film formability. When the thickness of the second pixel isolation layer 52 is greater than 2 μm, material waste is caused. When the thickness of the first pixel isolation layer 51 ranges from 0.6 to 4 μm, the thickness exceeding such a range makes processing difficult resulting in an increase in processing costs. By increasing the thickness of the pixel isolation layer of the bent area, mechanical stress generated by the flexible OLED display device during bending can be reduced, thereby improving the bending performance of the flexible OLED display device.

A pixel isolation layer is coated on the polymer flat layer 4 through a photolithography process. Then, etching the pixel isolation layer located corresponding to the flat area through the photolithography process but remaining the pixel isolation layer located corresponding to the bent area. The pixel isolation layer having a thickness of 0.5-2 μm is coated again on the polymer flat layer 4 to form the first pixel isolation layer 51 on the bent area and the second pixel isolation layer 52 on the flat area. Then, to etch all pixel regions through the photolithography process, and the anode is formed by filling the pixel regions.

Photolithography is a technique in which a pattern on a mask is transferred to a substrate through a photoresist under illumination. The main processes are as follows: first, the ultraviolet light is irradiated to a surface of a substrate with a photoresist film through the mask to cause a chemical reaction of the photoresist in an exposed area. Then, the photoresist in the exposed area or an unexposed area is dissolved by a developing technique (the former is called a positive photoresist, the latter is called a negative photoresist), and a pattern on the mask is copied onto the photoresist film. Finally, utilize an etching technique to transfer the pattern to the substrate.

The photolithography process is a process to protect bottom layers by a portion of a photosensitive material (also referred to as a photoresist) coated on a surface of a glass after exposure and development, and then, to carry out etching and stripping, and finally to obtain permanent patterns.

The organic layer 7 includes a hole injection layer, a hole transport layer, an electron blocking layer, a light emitting layer, an electron transport layer, an electron injection layer, a cathode, a cavity length adjustment layer, and a lithium fluoride (LiF) layer. The organic layer 7 is capable of releasing light energy functioning as a light source for a flexible OLED display device.

The encapsulation layer 8 is made of an inorganic material or an organic material. The inorganic material is at least one of SiNx, SiOx, silicon oxynitride (SiONx), silicon carbonnitride (SiCNx), and aluminum oxide ($Al_2O_3$). The organic material is at least one of acrylic and epoxy. The buffer layer 2 formed so is better in density and flatness, so that the organic layer 7 can be better prevented from being invaded by water and oxygen, internal materials are protected, and a life span of the flexible OLED display device is prolonged.

The structural layer 9 includes a polarizer, a touch layer, and a cover.

Figure 2:
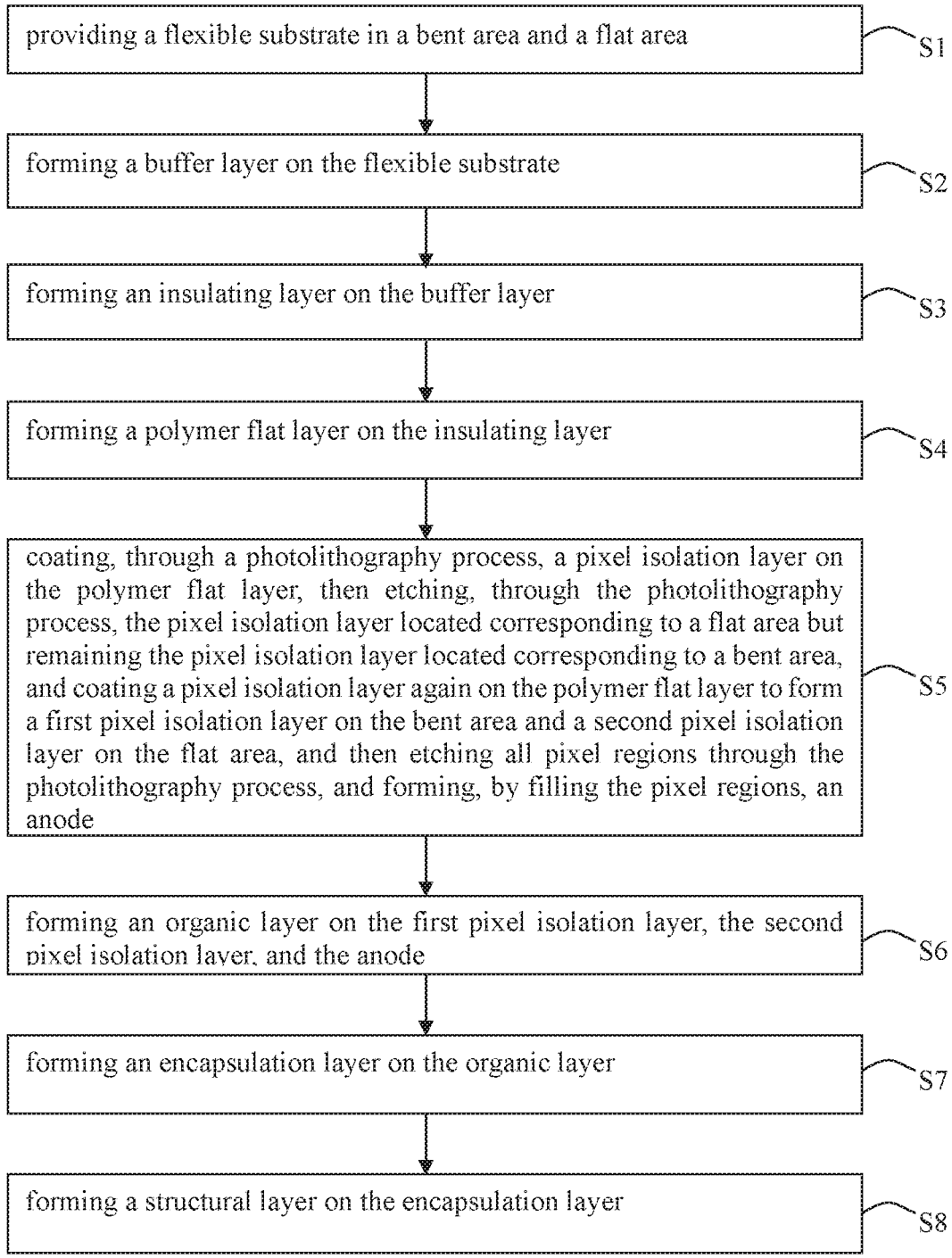
FIG. 2 is a flowchart of a method of manufacturing a flexible organic light emitting display device of the present invention.

A flowchart of a method of manufacturing a flexible organic light emitting display device of the present invention is shown in FIG. 2. The method includes: step S1: providing a flexible substrate 1; step S2: forming a buffer layer 2 on the flexible substrate 1; step S3: forming an insulating layer on the buffer layer 2; step S4: forming a polymer flat layer 4 on the insulating layer; step S5: coating, through a photolithography process, a pixel isolation layer on the polymer flat layer 4, then etching, through the photolithography process, the pixel isolation layer located corresponding to a flat area 200 but remaining the pixel isolation layer located corresponding to a bent area, and coating the pixel isolation layer again on the polymer flat layer 4 to form a first pixel isolation layer 51 on the bent area and a second pixel isolation layer 52 on the flat area, and then etching all pixel regions through the photolithography process, and forming, by filling the pixel regions, an anode 6; step S6: forming an organic layer 7 on the first pixel isolation layer 51, the second pixel isolation layer 52, and the anode 6; step S7: forming an encapsulation layer 8 on the organic layer 7; and step S8: forming a structural layer 9 on the encapsulation layer 8.

The flexible OLED substrate structure and the flexible OLED display device of the present invention are described in detail in the above-mentioned embodiments. It is understood that the exemplary embodiments described herein are to be considered as illustrative only, and are not intended to limit the invention. Descriptions of features or aspects in each exemplary embodiment should generally be considered as suitable features or aspects in other exemplary embodiments. While the invention has been described with reference to the preferred embodiments thereof, various modifications and changes can be made by those skilled in the art. The invention is intended to cover such modifications and modifications within the scope of the appended claims.

Although the present invention has been disclosed as a preferred embodiment, it is not intended to limit the present invention. Those skilled in the art without departing from the spirit and scope of the present invention may make various changes or modifications.

What is claimed is:

1. A method of manufacturing an organic light emitting display device, comprising:
   step S1: providing a flexible substrate;
   step S2: forming a buffer layer on the flexible substrate;
   step S3: forming an insulating layer on the buffer layer;
   step S4: forming a polymer flat layer on the insulating layer;
   step S5: coating, through a photolithography process, a pixel isolation layer on the polymer flat layer, then etching, through the photolithography process, the pixel isolation layer located corresponding to a flat area but remaining the pixel isolation layer located corresponding to a bent area, and coating the pixel isolation layer again on the polymer flat layer to form a first pixel isolation layer on the bent area and a second pixel isolation layer on the flat area, and then etching all pixel regions through the photolithography process, and forming, by filling the pixel regions, an anode;
   step S6: forming an organic layer on the first pixel isolation layer, the second pixel isolation layer, and the anode;
   step S7: forming an encapsulation layer on the organic layer; and
   step S8: forming a structural layer on the encapsulation layer.

2. The method of manufacturing the organic light emitting display device of claim 1, wherein the second pixel isolation layer has a thickness ranging from 0.5 to 2 micrometers.

3. The method of manufacturing the organic light emitting display device of claim 1, wherein the first pixel isolation layer has a thickness ranging from 0.6 to 4 micrometers.

4. The method of manufacturing the organic light emitting display device of claim 1, wherein the insulating layer is composed of a first insulating layer, a second insulating layer, and a third insulating layer, and the insulating layer further comprises a gate electrode, a source electrode, and a drain electrode disposed therein.

* * * * *

UNITED STATES PATENT AND TRADEMARK OFFICE
CERTIFICATE OF CORRECTION

PATENT NO. : 10,811,477 B2
APPLICATION NO. : 16/323775
DATED : October 20, 2020
INVENTOR(S) : Bo Wang Page 1 of 1

It is certified that error appears in the above-identified patent and that said Letters Patent is hereby corrected as shown below:

On the Title Page

Insert the following:
-- (30) Foreign Application Priority Data
Dec. 3, 2018 (CN) .................. 201811463397.2 --

Signed and Sealed this
Nineteenth Day of January, 2021

Andrei Iancu
*Director of the United States Patent and Trademark Office*